United States Patent [19]
Ward et al.

[11] 4,159,541
[45] Jun. 26, 1979

[54] MINIMUM PIN MEMORY DEVICE

[75] Inventors: William P. Ward; Donald K. Lauffer, both of Poway, Calif.

[73] Assignee: NCR Corporation, Dayton, Ohio

[21] Appl. No.: 812,290

[22] Filed: Jul. 1, 1977

[51] Int. Cl.² .................. G11C 8/00; G11C 7/00; G11C 5/06

[52] U.S. Cl. .................... 365/233; 365/63; 365/191; 365/221

[58] Field of Search .................. 340/173 R; 364/200 MS File, 900 MS File; 365/51, 191, 193, 194, 63, 195, 196, 221, 230, 233, 189, 226, 227, 239

[56] References Cited

U.S. PATENT DOCUMENTS

| 3,098,215 | 7/1963 | Waite | 365/233 X |
| 3,691,538 | 9/1972 | Haney et al. | 340/173 R |
| 3,786,277 | 1/1974 | Basse | 340/173 R |
| 3,855,580 | 12/1974 | Lighthall et al. | 365/233 X |
| 3,975,714 | 8/1976 | Weber et al. | 364/200 |
| 3,997,877 | 12/1976 | Naden | 365/233 X |
| 4,007,452 | 2/1977 | Hoff, Jr. | 340/173 R |
| 4,044,339 | 8/1977 | Berg | 340/173 R |
| 4,117,514 | 9/1978 | Terui et al. | 365/233 X |

FOREIGN PATENT DOCUMENTS 1935390  2/1970  Fed. Rep. of Germany .......... 365/230

Primary Examiner—Bernard Konick
Assistant Examiner—Donald McElheny, Jr.
Attorney, Agent, or Firm—J. T. Cavender; Edward Dugas; Stephen F. Jewett

[57] ABSTRACT

A coding technique and circuit implementation for reducing the number of electrical contacts to a memory device, which memory device is configured as part of a monolithic structure. Memory selection is achieved by changing at least one characteristic of a clock signal, such as pulse width. A read or write operation is selected by a mode selector, the level of which is determined by the level of the signal on a function contact when memory selection is achieved.

20 Claims, 12 Drawing Figures

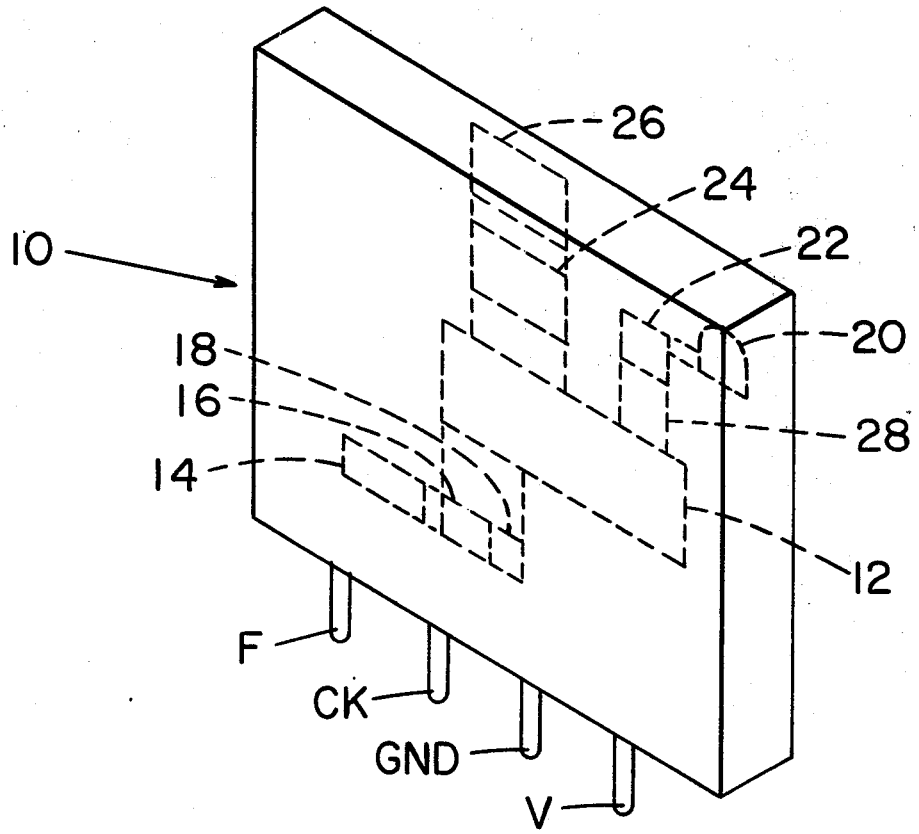

FIG. 5A
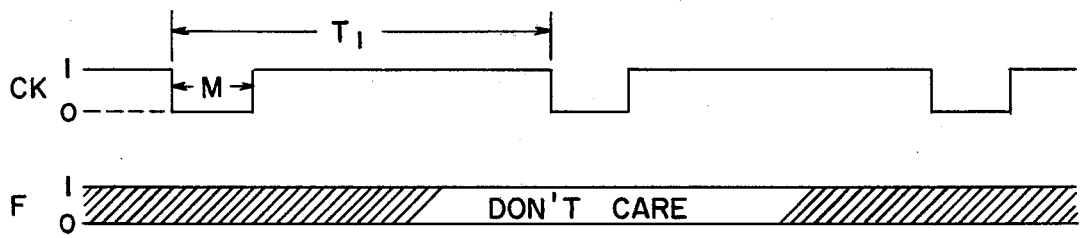
RECIRCULATE MODE
FIG. 5B
FIG. 5C
READ MODE
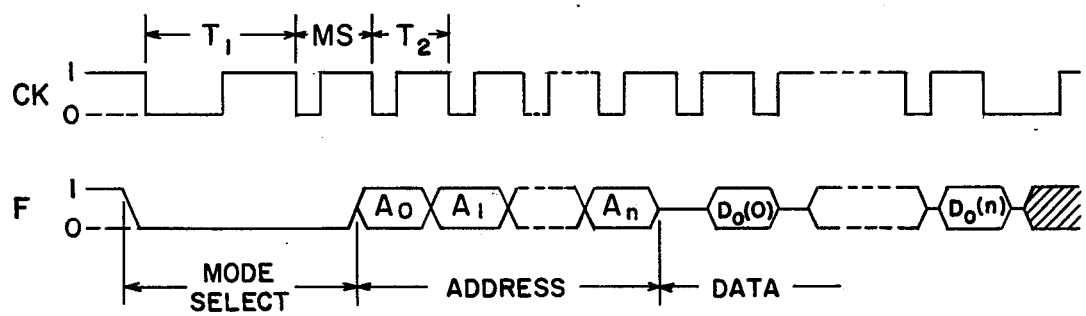
FIG. 5D
FIG. 6
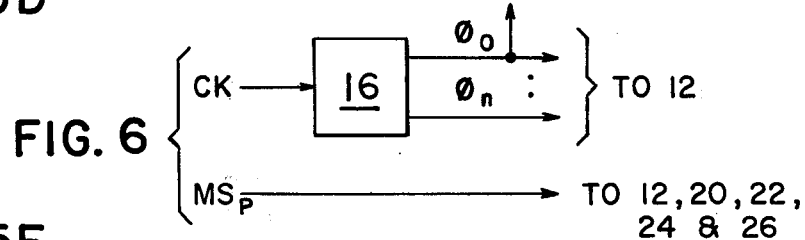
FIG. 5E
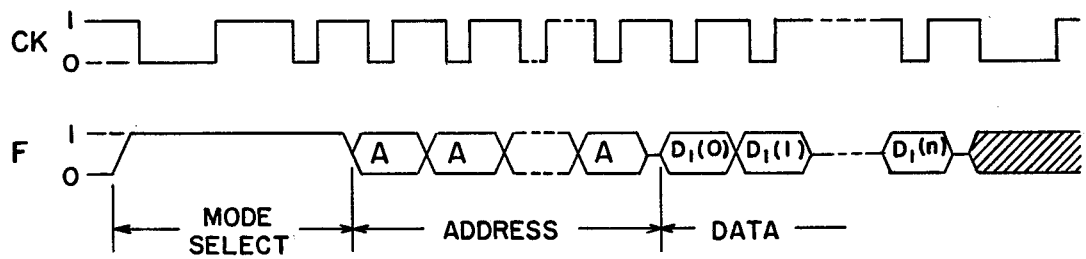
FIG. 5F

MINIMUM PIN MEMORY DEVICE

BACKGROUND OF THE INVENTION

The present invention is directed to a technique and circuitry for minimizing the number of electrical input terminals to a monolithic integrated electrical structure, which structure includes memory capabilities. More specifically, the present invention is directed to the merging of the functions associated with the operation of such a monolithic integrated electrical device so as to permit the reduction of electrical conductors and/or pins which connect the device in a system so as to, in turn, permit a substantially larger number of such devices to be placed in a given area.

Substantial research effort is continually expended by manufacturers of monolithic integrated circuits to substantially reduce the physical size and volume of monolithic integrated circuits in order to provide both increased circuit density and decreased cost, whereby the cost per bit of storage in high access speed static memories constructed utilizing such devices is comparable to the cost per bit of storage provided by relatively low access speed dynamic memories such as, for example, magnetic discs, drums, tapes, and the like. Even though integrated circuits (IC's) and large-scale integrated circuits (LSI's) have increased the density of electronic circuits per se substantially, the overall size and volume of the package thereof is still much too large to achieve the same relative packing density by high-speed static memories as achieved by relative low-speed dynamic magnetic memories. In the present state of the art, connections to these circuits are generally made by bonding leads to pads which are fixed on the chip supporting the integrated circuit and by bonding the leads to package tabs. The package houses the integrated circuit and the tabs project through the package. The tabs are electrically connected to conductors, which conductors are bonded to a circuit board and are routed on the circuit board to interconnect the package IC in its circuit environment. Each conductor occupies an area upon the board. The area occupied by the conductors detracts from the area occupied, or capable of being occupied, by an IC device, and therefore substantially reduces the density of the electronics on the circuit board. A reduction in the number of conductors on the board will, in turn, increase the area onto which additional IC devices may be positioned. An increase in IC devices in a particular area will of course increase the density of the IC's. Increased density is particularly important when dealing with memory devices in that the greater the density, the greater the number of memory bits that can be feasibly designed into a system having fixed physical constraints on size.

The present invention deals with the problem of increasing memory density by substantially decreasing the number of conductors and associated pins that are needed to interface to an integrated circuit type memory device.

SUMMARY OF THE INVENTION

In the preferred embodiment of the present invention, coding techniques are utilized for simultaneously merging two or more functions, which functions are directed to a monolithic integrated structure containing a memory means, and wherein at least one of the merged functions is digital in character.

A clock coding technique is preferably utilized for simultaneously providing a clocking function and a memory select function. Formating of signals applied to a bi-directional function line in conjunction with the level of the signal on the function line at the time the memory is selected controls the mode of operation of the memory means.

More specifically, the preferred embodiment is implemented utilizing a monolithic integrated structure which is comprised of, a memory element and a means for detecting a change in an applied synchronizing signal for enabling or for disabling the memory element. In addition, there is provided a means for selecting the mode of memory operation in response to a function signal at the time of enabling the memory element. Merging of the functions and formating of the functions provides a minimum electrical contact memory device.

From the foregoing, it can be seen that it is a primary object of the present invention to provide a minimum electrical contact device.

It is a further object of the present invention to merge the functions carried over electrical contacts in order to reduce the number of electrical contacts.

It is another object of the present invention to provide a device which is amiable to high-density packaging.

It is a further object of the present invention to accomplish all of the above objects at a minimum cost with an acceptable compromise in device speed.

These and other objects of the present invention will become more apparent when taken in conjunction with the following description and the attached drawings, wherein like characters indicate like parts, and which drawings form a part of the present disclosure.

BRIEF DESCRIPTION OF THE DRAWINGS

FIGS. 5A to 5F illustrate waveforms useful in understanding the operation of the preferred embodiment of FIG. 2; and FIG. 6 illustrates, in block diagram form, an alternate embodiment for a portion of the preferred embodiment illustrated in FIG. 2.

DESCRIPTION OF THE PREFERRED EMBODIMENT

Figure 1:
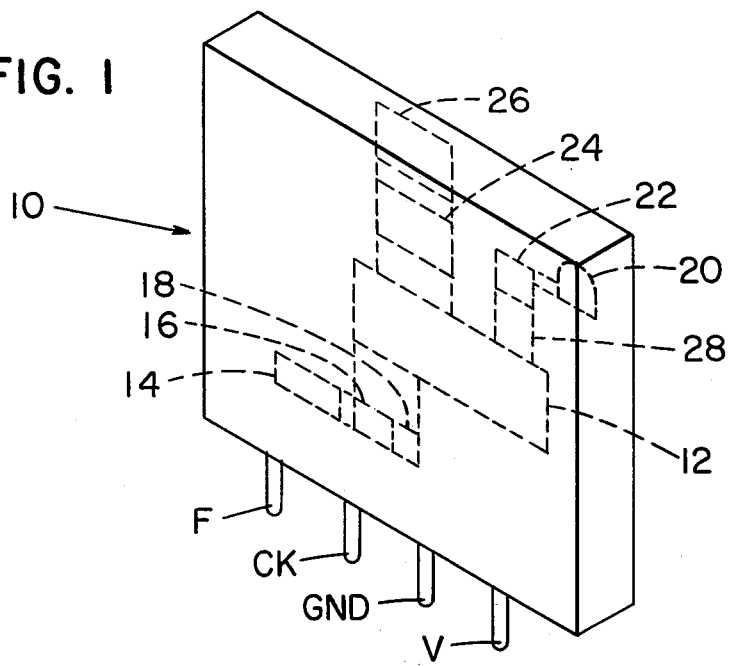
FIG. 1 is a perspective view illustrating a typical monolithic memory device embodying the present inventive concept.

Referring now to FIG. 1, there is illustrated therein a minimum electrical contact monolithic structure 10 containing monolithic integrated electronic components having a total of four electrical input pins (contacts) labeled CK, F, V and Gnd. A memory device 12, along with associated selection and enabling circuitry, is integrated into the structure 10. The selection and enabling circuitry includes an integral power supply 14 responsive to the voltage applied between pins V and Gnd for providing the voltage levels needed to operate the integrated electronics, a clock generator means 16, decoder means 18, gate means 20, mode selector means 22, address shift register 24, a shift register 26 and a gate 28. In the preferred operating environment of the present invention, the monolithic structure 10 is plugged into electrical contact with a circuit board by means of the input pins.

Figure 2:
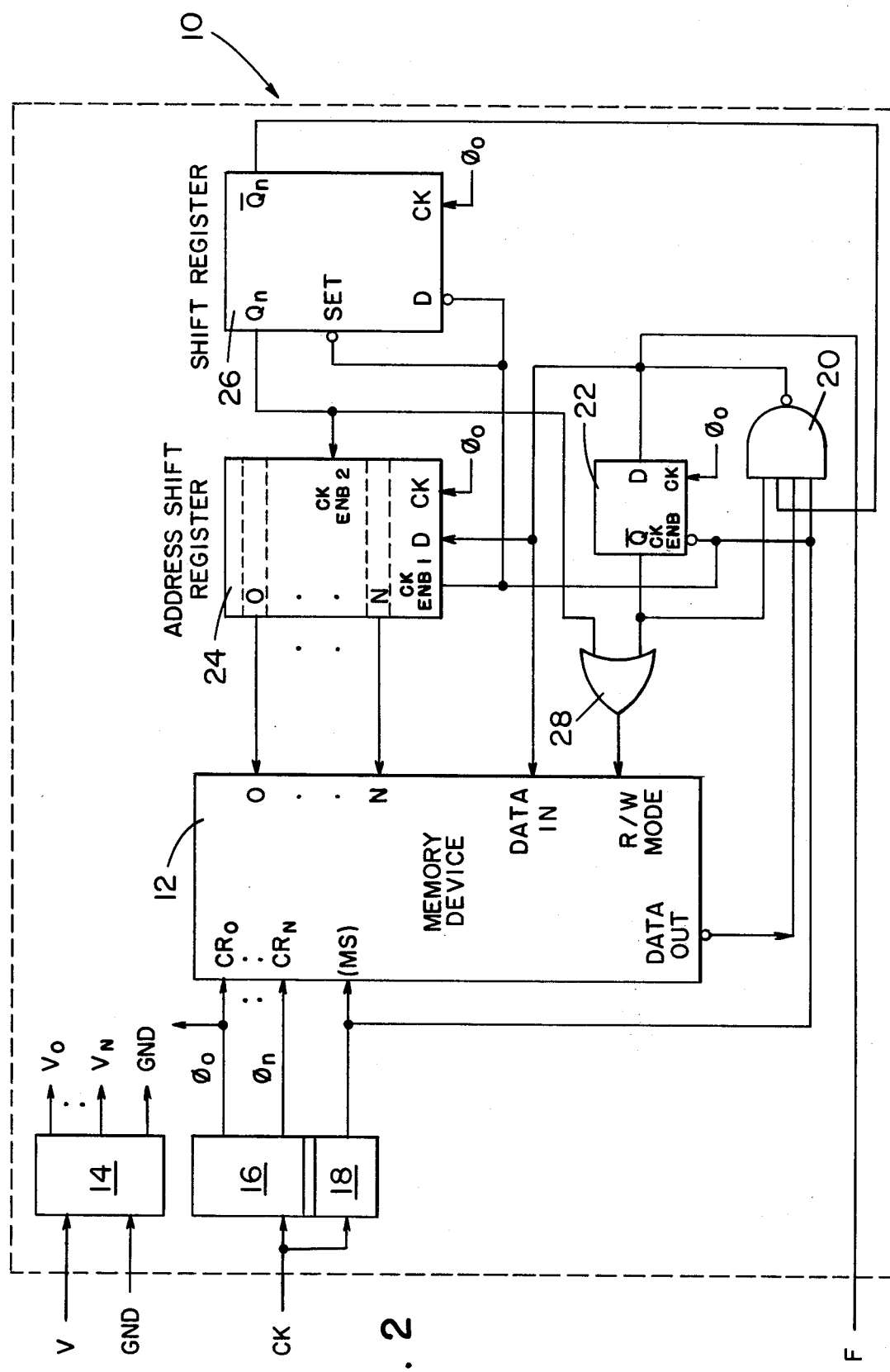
FIG. 2 is a block diagram illustrating the preferred embodiment of the present invention.

Referring now to FIG. 2, the preferred embodiment of the invention is illustrated in block diagram form. The pins labeled V and Gnd are electrically connected to the input of an internal power supply 14. The supply 14 provides the voltages, for example $V_O$ thru $V_N$, that are required to operate the integrated electronics. Power supplies which may be integrated into the monolithic structure 10 are well-known in the integrated circuit art and further description of the detailed construction thereof is not deemed necessary in order to insure a full and complete understanding of all aspects of the present invention. Such details of construction and operation may be found in Japanese Patent Application No. 146230/75, entitled "Voltage Multiplier," by G. C. Lockwood, which application is assigned to NCR Corporation the assignee of the present application. The referenced Japanese patent application was laid open for public inspection on July 22, 1976, and bears the Kokai (laid open) No. 83443/76. The pin CK is operatively connected to clock generator 16, which generator converts an input synchronizing signal for example, a clock signal, received on the CK pin into, internal clocking signals, for example, clocking signals $\phi_O$ and $\phi_N$. A decoder circuit 18, to be hereinafter described in detail, is operatively connected to the clock generator 16 for decoding a coded signal that is applied to the CK pin. The decoder circuit 18 provides a memory select signal MS, which signal changes state as a function of a code component contained in the coded signal that is applied to the CK pin.

Memory device 12 may be a charge coupled type memory device of the type described in the article "CCD Memories" by W. S. Kosonocky and D. J. Saver in *Electronic Design* 6, Mar. 15, 1976, pages V-520 to V-534. The memory device receives the memory select signal on its (MS) input and responds by being either activated or inhibited, depending on the state of the MS signal. As is common with memory devices, device 12 also has a plurality of address inputs labeled O to N, a DATA IN terminal, a READ/WRITE (R/W) mode selection terminal for instructing the memory to either read-out data or to write-in data, a DATA OUT terminal, and one or more clocking terminals $CR_O$, $CR_n$. A memory select signal applied to terminal (MS) enables the memory device such that data may be read out of or written into memory. The absence of a memory select signal will inhibit the memory thereby preventing data from being either read out of or written into the memory device.

A gate means 20, which may be a NAND gate, receives as gate control signals the memory or chip select signal MS from decoder 18, plus a mode selector signal, which signal is present at the $\overline{Q}$ output of a mode selector 22, and the signal from the $\overline{Q}_n$ output of a shift register 26. The gate means 20 also receives as the gated input the signal present at the DATA OUT terminal of the memory device. The output of gate means 20 is connected to the function pin F and will pass signals from the DATA OUT terminal of memory device 12 to the F pin when the gating signals to the NAND gate 20 are all at a high level, and will inhibit the passage of signals when one or more of the gating signals are of a low level. For purposes of this description, a low level is denoted as a "0" and a high level as a "1."

The mode selector means 22, which may be a well-known D-type flip-flop, is connected at its D input to the function pin F and at its output $\overline{Q}$ to the R/W mode terminal by means of an OR gate 28. The clock input CK of mode selector 22 is connected to receive the internal clock signal $\phi_O$. A clock enable input CK enb. is also provided, for either enabling or disabling flip-flop 22 regardless of the level of the clock signal $\phi_O$ appearing at the flip-flop terminal CK. The circle at the CK enb. input denotes that the flip-flop is enabled with a low level signal and disabled with a high level signal. Such being the case, the flip-flop is disabled when the memory is selected, that is when the signal MS is high.

As used in the preferred embodiment, a D-type flip-flop is one which transfers the signal level present on its D-input to its Q output upon the occurrence of a negative transition of the clock signal present on its CK input, and which maintains the signal level at the Q output until the next occurrence of a negative transition of the clock signal. A negative transition occurs when the clock signal changes from a high state to a low state.

An address shift register 24 having 0 to N storage locations or "cells" has its respective cells connected to the corresponding terminals O to N on the memory device 12. A D-input terminal to the shift register 24 is connected to the function pin F for entering address data into the shift register. A clocking terminal CK is connected to receive the internal clocking signal $\phi_O$ for clocking the address data through the address shift register. The shift register 24 is also provided with a clock enable input CK enb. 1, which input is connected to the MS line to the NAND gate 20 and to the SET and D inputs of the shift register 26. The clock signal $\phi_O$ is also applied to the CK input of shift register 26. The full (count) output of shift register 26, labeled $Q_n$, is directed to a clock enabling input CK enb. 2 on the address shift register 24. In addition, the $Q_n$ output from shift register 26 is connected to the other input of the OR gate 28. The register 26 is selected to step thru (shift) the signal on its D input in response to the clock signal $\phi_O$. The number of stages in the shift register 26 is selected to correspond to the number of bits contained in the address signal. A SET signal will initialize register 26 such that all the register stages are set to a count of 1. As the signal MS on the D input to register 26 is clocked thru the register by the clock signal, zeros are propagated through the length of the register. When the register is full, it outputs a "0" on its $Q_n$ output and disables the address shift register 24 thru the input CK enb. 2. In the preferred embodiment, four bits are used for address information, therefore register 26 is a four bit register.

Figure 3A:
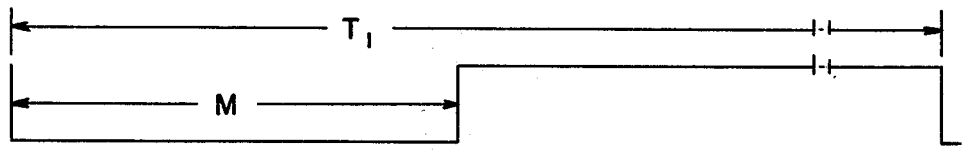
FIGS. 3A and 3B illustrate signals embodying one coding technique, which technique may be utilized with the preferred embodiment of FIG. 2.
Figure 3B:
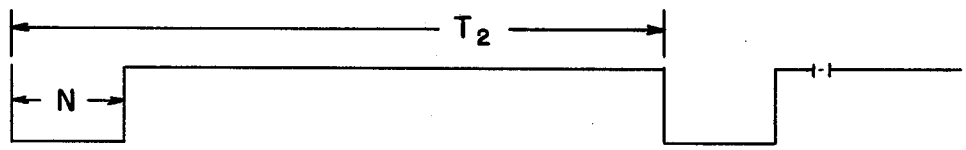

Referring now to FIGS. 3A and 3B, the coding technique used in the preferred embodiment of the invention is to decrease the pulse width of the clock signal applied to the CK pin in order to effect selection of the memory device. In FIG. 3A, the CK signal is depicted as having a pulse width of M and a period of $T_1$ between the leading edge of each succeeding pulse. If the memory device is, as in the preferred embodiment, a charge coupled type device or other type of volatile memory device, then the clock signal is used to refresh or to regenerate the memory, but the memory device is not selected when the clock signal of FIG. 3A is present. When memory device 12 is to be selected, the width of the pulse M of the clock signal is reduced to N as is shown in FIG. 3B. In addition, the rate or frequency of the narrowed pulse N clock signal can be increased in order to speed up the operation of the memory. The one limitation that exists with this particular coding technique as regarding the increase in rate is that the period $T_2$ must not be less than the pulse width M, otherwise erroneous memory selection will be effected unless additional detection circuitry is utilized.

The clock signal CK thus carries two pieces of information in coded form, one is the synchronizing (clock) rate and the other is the selection or non-selection of the memory device. Although in this preferred embodiment there is shown a pulse width technique for coding the CK signal, it will be obvious to those persons skilled in the art that other types of coding techniques such as, for example, amplitude and/or frequency coding could also be used with equal success.

Figure 4:
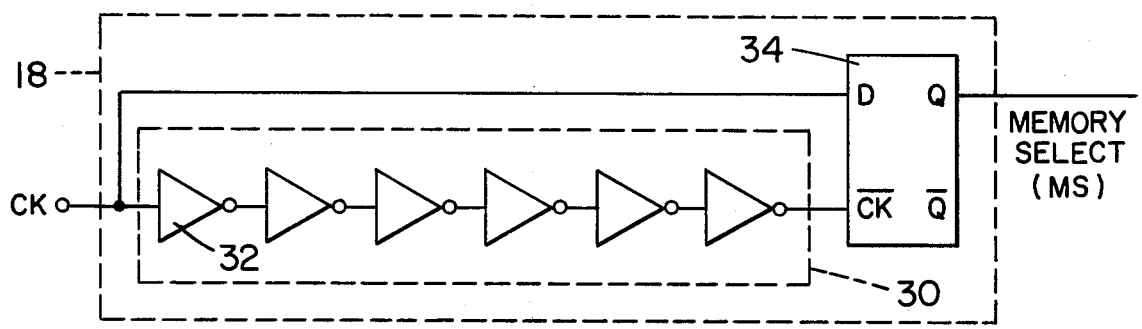
FIG. 4 illustrates a decoding device which may be used to decode the signals of FIGS. 3A and 3B.

A suitable decoding circuit for decoding the coded clock signal CK to provide the memory select signal MS is shown in detail in FIG. 4. In FIG. 4 there is provided a delay network 30 comprised of six serially connected inverters 32. The total time delay provided by the serially connected inverters is equal to $$(M-N)/2+N,$$

where M and N are the pulse widths of the clock signal shown in FIGS. 3A and 3B, respectively. The input to the delay network 30 is the externally applied clock signal CK. The delayed output from the delay network 30 is directed to the $\overline{CK}$ input of a D type flip-flop 34. The D input of flip-flop 34 is connected to the CK input to decoder 18. The Q output from flip-flop 34 is the memory select signal MS, whereas, the $\overline{Q}$ output therefrom is the memory select signal MS in the inverted form.

Referencing the waveforms shown in FIGS. 5A to 5F, in conjunction with the preferred embodiment shown in FIG. 2, the operation of the device and the techniques used will now be described in detail. FIGS. 5A and 5B described the recirculate mode for the case when a volatile memory such as a CCD memory is used for the memory device 12. The recirculate mode also corresponds to the non-select mode in that the memory is not being selected. The CK signal is shown having a pulse width M and a period equal to $T_1$. The period $T_1$ is chosen to provide adequate rejuvenation of the memory device with the use of minimum power. The signal level on the function pin F shown in FIG. 5B can be at any level due to the fact that the select signal MS does not effect selection of the memory device.

In FIGS. 5C and 5D, the READ MODE of operation is depicted. The signal present on the function pin F carries three major segments of instruction; the first segment is mode select, the second is the address and the third is the data. Mode selection is determined merely by the level of the signal present on the pin F and, in turn, at the D input of the mode selector flip-flop 22 when the memory select signal MS is generated. The flip-flop 22 is latched onto the level present at its $\overline{Q}$ output by the memory select signal MS because it disables the flip-flop from further toggling in that the MS signal is applied to the flip-flop's CK enb. input. A reference to FIG. 5C shows the READ MODE being selected in response to the signal on the function pin F being at a low level just prior to the generation of the memory select signal MS. The clock signal CK is decreased in pulse width to N, and the period of that particular portion of the clock signal is decreased to $T_2$. The first period during which the pulse width is changed is labeled MS denoting memory select. In the READ MODE the $\overline{Q}$ output is high and the output of the OR gate is also high. A high level signal on the R/W mode terminal of memory device selects the READ MODE of memory operation. A low level signal on the R/W mode terminal selects the WRITE MODE of memory operation.

The decoder 18 senses the change in the pulse width of the clock signal and outputs the memory select signal to the (MS) terminal of memory device 12. Those signals present on the function pin F are then directed to the D input of the shift register 24 and to the DATA IN terminal of memory device 12. The signals on pin F are formated such that the next following N bits corresponding to the desired first address bits $A_O$ to $A_N$ will be loaded into shift register 24 at the clock rate $\phi_O$. Shift register 24 is enabled by receipt of the memory select signal MS at its clock enable terminal CK enb. 1. When the address bits have been completely loaded into the address register 24, the shift register 26 disables shift register 24 by the application of a low level signal to the CK enb. 2 input of shift register 24 and the data corresponding to the loaded address in memory device 12 is serially fed to the DATA OUT terminal of the memory device 12 in synchronism with the subsequent $\phi_O$ pulses. The NAND gate 20 receives a high level output from the $\overline{Q}$ output of the mode selector 22, along with the high level signal from the $\overline{Q}_n$ output of the shift register (when the address signal has been completely loaded into the address shift register 24), and, in addition, the high level memory select signal MS. Because the memory device 12 has been selected, as previously described, the NAND gate 20 is enabled and passes the serial data DO(O) to DO(n) (FIG. 5D) from the DATA OUT terminal of memory device 12 to the function terminal F.

In FIGS. 5E to 5F the WRITE MODE of operation is depicted. The mode selector 22 is toggled to output a low level signal at its $\overline{Q}$ output in response to the high level signal present at its D input from function pin F. The occurrence of a memory select signal MS disables the flip-flop latching the mode latch in the WRITE MODE. When the WRITE MODE is selected, NAND gate 20 is disabled due to the low level of the signal present at the $\overline{Q}$ output of the mode selector. FIG. 5E shows the clock CK changing to the memory select MS pulse width, which causes the generation of the memory select signal MS by the decoder 18. The address register 24 is again enabled by the presence of the memory select signal at its CK enb. 1 input, and the register 26 will be initialized by the memory select signal on its SET input. The write address is then directed to the function pin F and entered into the address register at its D input. Although the $\overline{Q}$ output of the mode selector is low, indicating a WRITE MODE of operation, the other input to the OR gate 28 is at a high level which causes the output of the OR gate to remain high. A high input on the R/W mode terminal maintains the memory device in the READ MODE of operation. The memory is held in the READ MODE as the write address is loaded into the address shift register in order to prevent the writing of address bits into associated memory locations as data bits. This would occur if the memory were not held in the READ MODE because the address bits also appear at the memory's DATA IN terminal at the same time as they appear on the D input of register 24. Once the address bits are loaded, shift register 26 will output a low level signal on its $Q_n$ output, which signal will appear at the other input to OR gate 28 causing the output of OR gate 28 to go low. With the output of OR gate 28 low, the memory device will be switched into the WRITE MODE. In addition, when the $Q_n$ output goes low the address shift register 24 is disabled. The data bits $D_1(O)$ to $D_1(n)$ are then placed on the function pin and written into memory at the address specified by the outputs O to N of register 24. After the data is written into memory, a change in clock width back to M will cause the memory select signal to de-select the memory device.

FIG. 6 illustrates an alternate embodiment of the invention wherein the memory select signal MS is not generated from the decoding of a coded synchronizing signal but, instead, is generated external of the monolithic structure and applied to an additional pin labeled MSp. The pin MSp is connected to the (MS) terminal of memory device 12, an input of NAND gate 20, the CK enb. input of flip-flop 22, the CK enb. 1 input of the address shift register 24, and the SET and D input of shift register 26.

The clock signal applied to the pin CK remains directed to the clock generator 16, with the clock outputs $\phi_O$ through $\phi_n$ directed to the inputs $CR_O$ through $CR_n$ of the memory device 12.

Although a specific preferred embodiment of the invention has been shown in detail, it will be understood by those skilled in the art that the foregoing and other changes in form and details may be made therein without departing from the spirit and scope of the invention. For example, while the preferred embodiment has been described as utilizing a charge coupled type of memory device, it will be immediately obvious to those skilled in the art, following a full understanding and appreciation of the novel aspects of the present invention, that such coding technique is applicable to other well-known monolithic integrated circuit structures such as, for example, bubble type memories, shift registers, random access memories, read only memories and the like.

What is claimed is:

1. A monolithic integrated structure comprising:
a memory element;
first input means for receiving a synchronizing signal for clocking said memory element;
means for detecting a predetermined change in said synchronizing signal for selectively enabling said memory element;
second input means for receiving a function signal; and
means for mode selecting said memory element in response to said function signal coincidentally with the selective enabling of said memory element.

2. The structure according to claim 1 wherein said mode selecting means includes:
means for selecting the direction of accessing said memory element in response to the change in said synchronizing signal and in response to said function signal.

3. The structure according to claim 1 wherein said synchronizing signal is a repetitive pulse signal and wherein said change in said synchronizing signal is a change in the pulse width of said synchronizing signal, and wherein said means for detecting is comprised of:
a delay network for receiving said synchronizing signal and for delaying said signal for a fixed period; and
means responsive to the delayed signal from said delay network and the undelayed synchronizing signal for providing a first state signal when the delayed and the undelayed synchronizing signals occur coincidently and a second state signal when the signals do not occur coincidently, said first and second state signals directed to said memory element for selectively enabling said memory element.

4. The structure according to claim 1 and further comprising:
means for bi-directionally accessing said memory element operatively connected between said memory element and said second input means.

5. The structure according to claim 4 wherein said mode selecting means comprises:
selecting means having an input connected to said second input means and an output connected to a mode selection input of said memory element for selecting the direction of access to said memory element; and
gate means having at least one input connected to an output of said memory element and an output connected to said second input means for responding to the state of said selecting means so as to connect said memory element output to said second input means.

6. A monolithic integrated structure including a memory device comprised of:
a first terminal for receiving a coded input signal, which signal is comprised of at least a timing component for clocking said memory device and a memory selection component;
detecting means operatively connected to said first terminal for detecting the presence of said memory selection component in said coded input signal;
a second terminal electrically connected to a data input of said memory device;
a mode selector responsive to the signal from said detecting means and to signals present on said second terminal for providing a mode selection signal to said memory device;
gate means for operatively connecting a data output of said memory device to said second terminal in response to the signal from said detecting means and said mode selector;
address means operatively connected between said second terminal and said memory device for addressing said memory device; and
means for coupling power to said monolithic integrated structure.

7. The structure according to claim 6 and further comprising:
register means operatively responsive to the timing component of said coded input signal for counting timing component equivalent to the address for addressing said memory device, said register means providing a signal for disabling said address means at the completion of entry of the address to said address means.

8. A monolithic integrated structure comprising:
a memory device having at least a data input and a data output;
a first terminal for receiving a synchronizing signal on said integrated structure for clocking said memory device;
a second terminal for receiving a function signal on said integrated structure;
bi-directional means for selectively connecting said input and said output to said second terminal; and means for detecting a predetermined change in said synchronizing signal received at said first terminal for selectively enabling said memory device.

9. A monolithic integrated structure according to claim 8 and further comprising:
address means operatively connected to said memory device and adapted to be enabled when said memory device is enabled, said address means receiving address information from said second terminal in order to address said memory device.

10. A monolithic integrated structure according to claim 9, and further comprising:
register means operatively connected to said address means for inhibiting said address means when a full address signal has been received by said address means.

11. A monolithic integrated circuit memory system comprising:
an addressable matrix of storage locations;
first means for addressing a selected storage location;
second means for storing information in said selected storage location; and
means for applying a plurality of operating signals to said memory system to initiate operation of said first and second means, at least one of said operating signals being comprised of both a memory selection component for selectively enabling said memory system and a timing component for clocking said memory system.

12. A monolithic integrated circuit memory system comprising:
a matrix of addressable storage locations;
means for applying a plurality of operating signals to said memory system, at least one of said operating signals having a characteristic for timing said memory system and having a predetermined change in a characteristic thereof for enabling said memory system; and
means responsive to said operating signals and to said change in characteristic of said at least one operating signal to store information in addressed storage locations.

13. A monolithic integrated structure comprising:
a memory element;
means for detecting a predetermined change in a first operating signal and for selecting said memory element in response to said detected change, said first operating signal comprising a synchronizing signal for timing said memory element; and
means operatively connected to said memory element for setting the mode of memory element operation in response to the state of a second operating signal at the time said memory element is selected.

14. A monolithic integrated structure comprising:
a memory element having a read and a write mode of operation;
a first terminal for receiving a synchronizing signal for timing said memory element;
means operatively connecting said memory element to said first terminal, for selecting said memory element in response to a predetermined change in a characteristic of said synchronizing signal applied to said first terminal;
a second terminal; and
means operatively connecting said memory element to said second terminal for selecting the read or write mode of memory operation in coincidence with the change in characteristic of said synchronizing signal applied to said first terminal.

15. A monolithic integrated structure comprising:
a memory element operatively connected to at least two electrical signal paths, with at least one of said signal paths being bi-directional;
means for selecting said memory element in response to a predetermined change in signal characteristics of a synchronizing signal for timing said memory element on one at said two electrical signal paths; and
means for controlling the mode of memory element operation in response to the characteristics of a signal on the other of said two electrical signal paths at the time said memory element is selected.

16. A monolithic integrated structure comprising:
a memory device having a plurality of addressable memory locations and also having at least an input, an output, a clocking input, a power input and an enabling input;
a function terminal on said integrated structure for serially receiving bit-by-bit mode select, date in, data out and address signals;
bi-directional means for selectively connecting said input and said output to said function terminal;
a selection terminal on said integrated circuit structure operatively connected to said enabling input for receiving a memory device selection signal for enabling said memory device;
a clocking terminal on said integrated structure operatively connected to said clocking input for receiving a synchronizing signal; and
at least one power terminal on said integrated structure operatively connected to said power input for receiving a power signal.

17. A monolithic integrated structure according to claim 16 and further comprising:
address means operatively connected to said memory device and adapted to be enabled when said memory device is enabled, said address means receiving said address signal from said function terminal in order to address said memory device.

18. A monolithic integrated structure according to claim 17 and further comprising:
register means operatively connected to said address means for inhibiting said address means when a full address signal has been received by said address means.

19. In a device in the form of an integrated circuit structure and having a memory element:
first terminal means for receiving a periodic synchronizing signal for timing said memory element;
means for detecting a predetermined change in said synchronizing signal for enabling said memory element;
second terminal means for receiving a second, function signal capable of including an initial signal component for representing the mode of memory element operation, a signal component representing the address of a memory location within said memory element, a signal component representing data to be written into said memory element, and a signal component representing data read from said memory element; and
mode selection means for receiving said function signal for controlling the mode of memory element operation in response to the condition of said mode representing signal component.

20. In a device having a memory element, with said memory element having a plurality of memory locations and with each memory location having an associated address:
- bi-directional terminal means for receiving a function signal, said function signal capable of including a signal component representing the mode of memory element operation, a signal component representing the address of a memory location, a signal component representing data to be stored in said memory element, and a signal component representing data read from said memory element; and
- means for mode selecting said memory element by detecting the condition of said signal component representing the mode of memory element operation.